US012663477B2

(12) United States Patent
Kuranuki et al.

(10) Patent No.: US 12,663,477 B2
(45) Date of Patent: Jun. 23, 2026

(54) SIGN DETECTION SYSTEM, SIGN DETECTION METHOD, AND SIGN DETECTION PROGRAM

(71) Applicant: Panasonic Intellectual Property Management Co., Ltd., Osaka (JP)

(72) Inventors: Masaaki Kuranuki, Kyoto (JP); Masaaki Takegata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 198 days.

(21) Appl. No.: 18/579,188

(22) PCT Filed: Jun. 29, 2022

(86) PCT No.: PCT/JP2022/025865
§ 371 (c)(1),
(2) Date: Jan. 12, 2024

(87) PCT Pub. No.: WO2023/002815
PCT Pub. Date: Jan. 26, 2023

(65) Prior Publication Data
US 2024/0337698 A1 Oct. 10, 2024

(30) Foreign Application Priority Data
Jul. 20, 2021 (JP) ................................. 2021-119342

(51) Int. Cl.
| | |
|---|---|
| *G01R 31/382* | (2019.01) |
| *B60L 58/16* | (2019.01) |
| *G01R 31/374* | (2019.01) |
| *H01M 10/48* | (2006.01) |
| *H02J 7/40* | (2026.01) |

(Continued)

(52) U.S. Cl.
CPC ........... *G01R 31/382* (2019.01); *B60L 58/16* (2019.02); *G01R 31/374* (2019.01); *H01M 10/482* (2013.01); *H01M 10/486* (2013.01); *H02J 7/40* (2026.01); *H02J 7/60* (2026.01); *H02J 7/80* (2026.01); *B60L 2240/549* (2013.01); *H01M 2220/20* (2013.01)

(58) Field of Classification Search
None
See application file for complete search history.

(56) References Cited

U.S. PATENT DOCUMENTS

2020/0114775 A1* 4/2020 Tsurutani .......... H02J 7/007188
2020/0116797 A1* 4/2020 Tsurutani ............. H01M 10/48

FOREIGN PATENT DOCUMENTS

JP 2003-009405 A 1/2003

OTHER PUBLICATIONS

International Search Report received in International Application No. PCT/JP2022/025865, mailed Aug. 9, 2022.

* cited by examiner

*Primary Examiner* — Jas A Sanghera
(74) *Attorney, Agent, or Firm* — WHDA, LLP

(57) ABSTRACT

In a sign detection system, a battery data acquisition unit acquires battery data including current data obtained by periodically measuring a current flowing through a battery pack. When the current data in a period of charging the battery pack by a charger include a section temporarily having a current value of zero, a determination unit determines that the occurrence of the section having the current value of zero is a sign of unavailability of the battery pack.

10 Claims, 11 Drawing Sheets

(51) Int. Cl.
  H02J 7/60          (2026.01)
  H02J 7/80          (2026.01)

FIG. 7

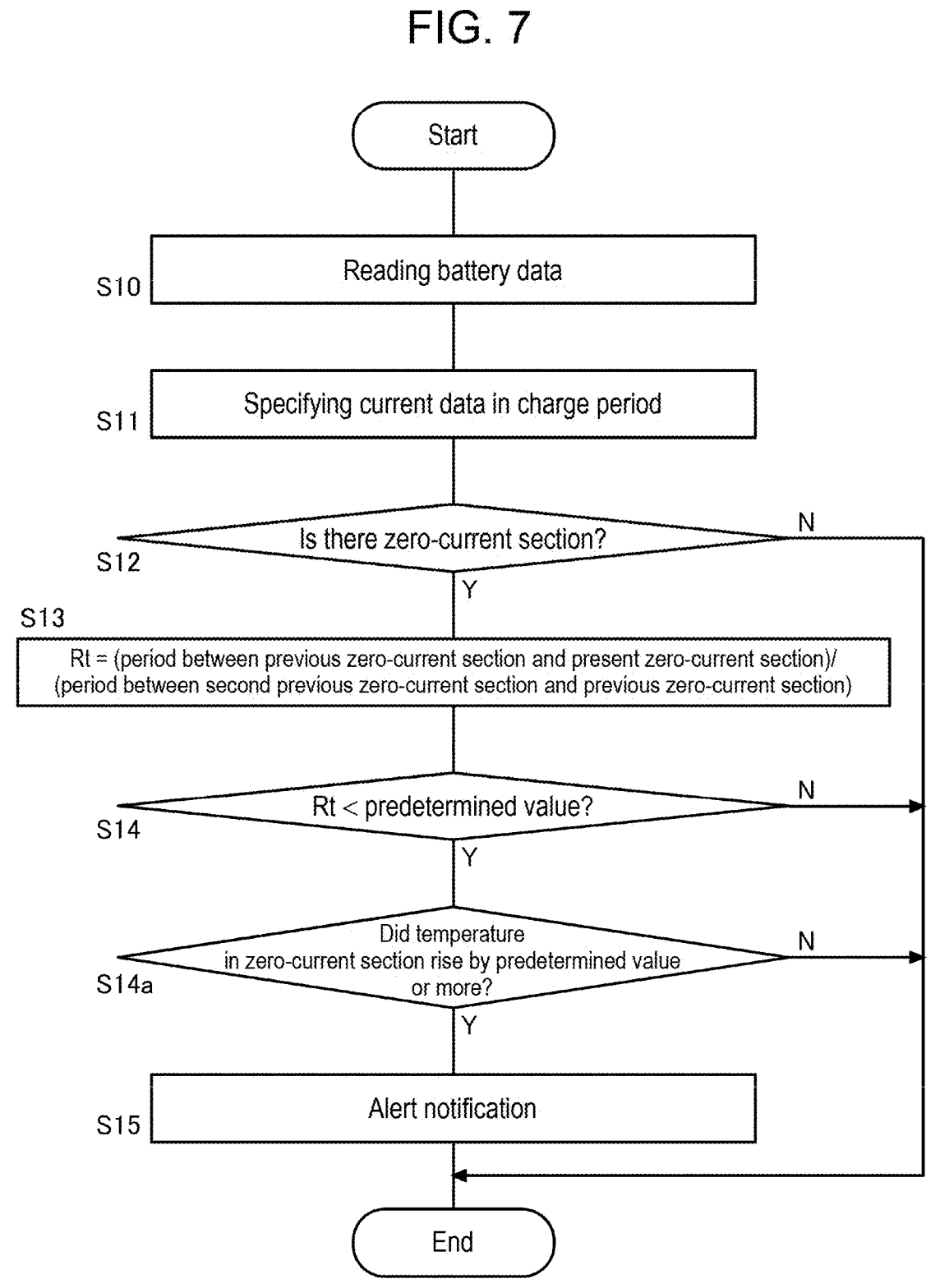

```
                    ┌──────────┐
                    │  Start   │
                    └──────────┘
                         │
        ┌────────────────────────────────────┐
  S10   │       Reading battery data         │
        └────────────────────────────────────┘
                         │
        ┌────────────────────────────────────┐
  S11   │  Specifying current data in charge period  │
        └────────────────────────────────────┘
                         │
                    ◇ Is there zero-current section? ────── N ───┐
  S12                    │                                       │
                         Y                                       │
                                                                 │
  S13                                                            │
  ┌──────────────────────────────────────────────────────────┐  │
  │ Rt = (period between previous zero-current section and present zero-current section)/ │  │
  │ (period between second previous zero-current section and previous zero-current section) │  │
  └──────────────────────────────────────────────────────────┘  │
                         │                                       │
                    ◇ Rt < predetermined value? ────── N ───────┤
  S14                    │                                       │
                         Y                                       │
                                                                 │
                    ◇ Did temperature                            │
              in zero-current section rise by predetermined value ── N ──┤
  S14a              or more?                                      │
                         │                                       │
                         Y                                       │
        ┌────────────────────────────────────┐                  │
  S15   │        Alert notification          │                  │
        └────────────────────────────────────┘                  │
                         │◄─────────────────────────────────────┘
                    ┌──────────┐
                    │   End    │
                    └──────────┘
```

FIG. 9

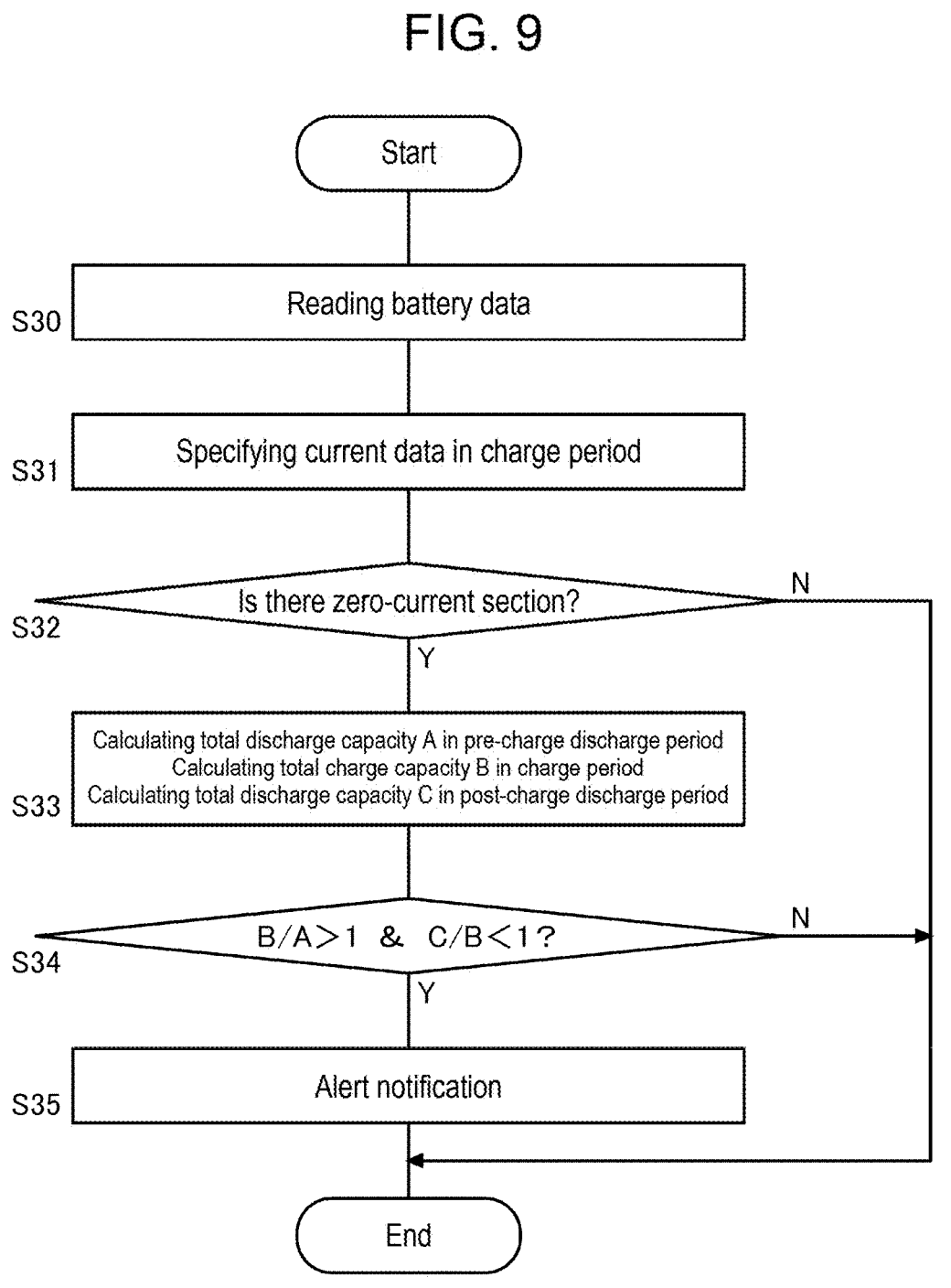

Start

S30 — Reading battery data

S31 — Specifying current data in charge period

S32 — Is there zero-current section?  → N

Y

S33 — Calculating total discharge capacity A in pre-charge discharge period
Calculating total charge capacity B in charge period
Calculating total discharge capacity C in post-charge discharge period

S34 — B/A>1 & C/B<1?  → N

Y

S35 — Alert notification

End

FIG. 10

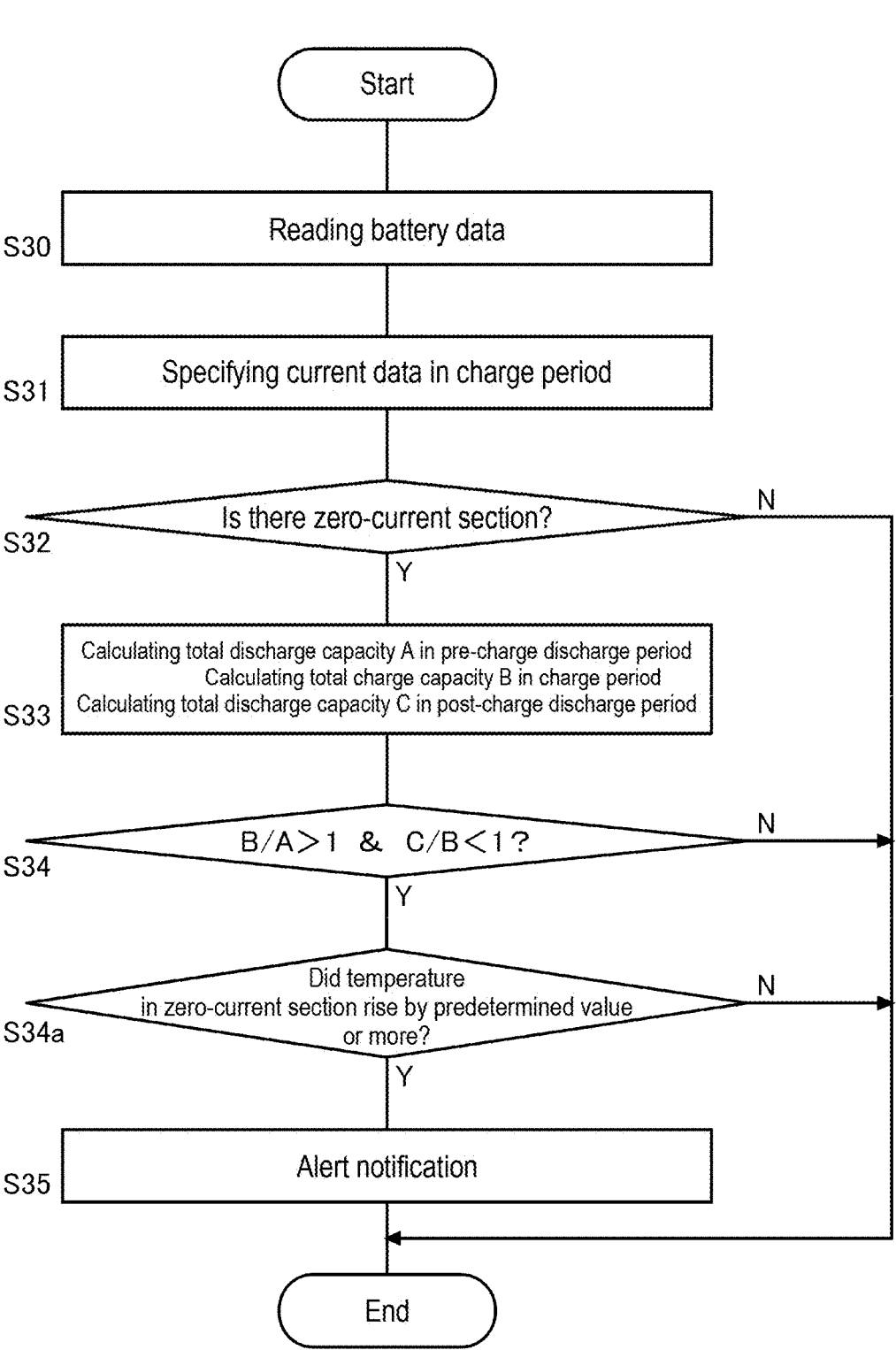

Start

S30  Reading battery data

S31  Specifying current data in charge period

S32  Is there zero-current section?     N

Y

S33  Calculating total discharge capacity A in pre-charge discharge period
Calculating total charge capacity B in charge period
Calculating total discharge capacity C in post-charge discharge period

S34  B/A＞1 ＆ C/B＜1 ?     N

Y

S34a  Did temperature
in zero-current section rise by predetermined value
or more?     N

Y

S35  Alert notification

End

SIGN DETECTION SYSTEM, SIGN DETECTION METHOD, AND SIGN DETECTION PROGRAM

CROSS-REFERENCE TO RELATED APPLICATIONS

This application is the U.S. National Phase under 35 U.S.C. § 371 of International Application No. PCT/JP2022/025865, filed on Jun. 29, 2022, which claims the benefit of foreign priority to JP Patent Application No. 2021-119342 filed on Jul. 20, 2021, the entire contents of each of which are hereby incorporated by reference.

BACKGROUND

Technical Field

The present disclosure relates to a sign detection system, a sign detection method, and a sign detection program, each being for detecting a sign of the occurrence of abnormalities such as heat generation and fire caught by a battery.

Description of the Related Art

Electric vehicles (EV) have been widely used mainly for commercial vehicles such as delivery vehicles. In recent years, there has been built an environment in which EV running data (such as battery information and vehicle control information) are stored in the cloud and can be utilized in many fields.

When the deterioration of a lithium ion battery progresses, lithium metal is deposited in a tree form and penetrates a separator, which sometimes results in an internal short-circuit between a positive electrode and a negative electrode. When a current flows through the short-circuit path, the short-circuit path is instantly fused, whereby insulation between the positive electrode and the negative electrode is restored. As the deterioration of the lithium ion battery progresses, the frequency of occurrence of the instant short-circuit caused by the metal deposition increases, and eventually the battery becomes unusable. Furthermore, the frequent occurrence of the instant short-circuit caused by the metal deposition increases the risk of catching fire.

A method for detecting an instant short-circuit caused by metal deposition, based on an instant decrease in battery voltage, has been proposed (for example, see Patent Literature 1).

CITATION LIST

Patent Literature 1: Japanese Unexamined Patent Application Publication No. 2003-009405

SUMMARY

However, voltage disturbance based on an instant short-circuit caused by metal deposition is in the order of milliseconds, and the range of changes in voltage is approximately several 10 mV. Therefore, when voltage is not monitored by high-speed sampling, a failure of detection easily occurs. To monitor changes in voltage with high accuracy by high-speed sampling, a measurement system with higher specifications, a bulk memory, and high-speed communication are needed. This causes an increase in cost and power consumption.

The present disclosure has been made in view of these circumstances, and an object of the present disclosure is to provide techniques of detecting a sign of an unusable battery, with high accuracy at low cost.

To solve the above-mentioned problem, a sign detection system according to one aspect of the present disclosure includes: an acquisition unit configured to acquire battery data including current data obtained by periodically measuring a current flowing through a battery pack; and a determination unit configured to, when the current data in a period of charging the battery pack by a charger include a section temporarily having a current value of zero, determine that the occurrence of the section having the current value of zero is a sign of the unusable battery pack.

Note that any combination of the above-mentioned constituents, and what is obtained by converting between a device, a system, a computer program, and a storage storing the computer program concerning the expression of the present disclosure are also effective as aspects of the present disclosure.

According to the present disclosure, a sign of an unusable battery can be detected with high accuracy at low cost.

BRIEF DESCRIPTION OF THE DRAWINGS

FIG. 7 is a flow chart illustrating the flow of a second processing example of detecting the sign of the unusable battery pack, by using the sign detection system according to the embodiment.

FIG. 9 is a flow chart illustrating the flow of a fourth processing example of detecting the sign of the unusable battery pack, by using the sign detection system according to the embodiment.

FIG. 10 is a flow chart illustrating the flow of a fifth processing example of detecting the sign of the unusable battery pack, by using the sign detection system according to the embodiment.

DETAILED DESCRIPTIONS

Figure 1:
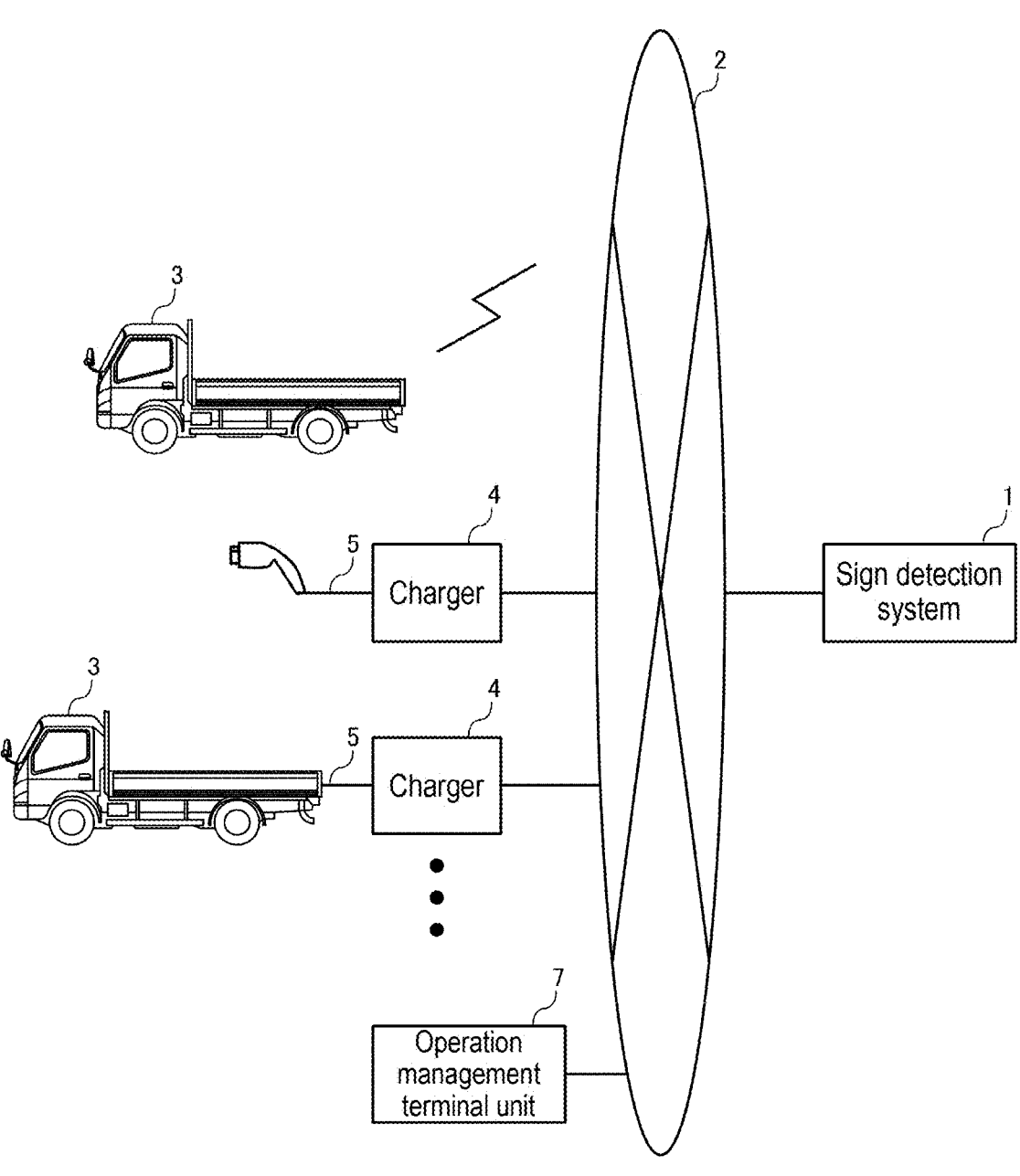
FIG. 1 is a schematic diagram of a sign detection system according to an embodiment.

FIG. 1 is a schematic diagram of sign detection system 1 according to an embodiment. Sign detection system 1 according to the embodiment is a system for detecting a sign indicating that battery pack 31 (see FIG. 2) installed in motor vehicle 3 becomes unusable in the future. The unusable state of battery pack 31 includes an unusable state caused by the occurrence of abnormalities such as heat generation, fire, and disconnection and an unusable state caused by the end of its life. Examples of the sign of battery pack 31 becomes unusable in the future include the frequent occurrence of an instant short-circuit caused by metal deposition and a poor connection due to corrosion and looseness of a fastening unit (such as a bus bar or a screw). When a current path is lost due to corrosion or disengagement of the fastening unit, the risk of occurrence of arc discharge arises.

In FIG. 1, an example is illustrated in which a delivery company uses sign detection system 1. Sign detection system 1 may be built, for example, in the own facility of a service provider that provides an operation management support service for motor vehicle 3 or on its own server provided in a data center. Alternatively, sign detection system 1 may be built on the cloud server to be used based on a cloud service contract. Alternatively, sign detection system 1 may be built on a plurality of servers dispersed in a plurality of bases (a data center and a company's own facility). The servers may be a combination of a plurality of company's own servers, a combination of a plurality of cloud servers, or a combination of a company's own server and a cloud server.

Delivery companies each possess a plurality of motor vehicles 3 and at least one charger 4, and have a delivery base for parking motor vehicles 3. Motor vehicles 3 each are connected to charger 4 by charging cable 5, and battery pack 31 installed in each of motor vehicles 3 is charged by charger 4 via charging cable 5.

Operation management terminal unit 7 is provided in a delivery base of the delivery company. For example, a PC constitutes operation management terminal unit 7. Operation management terminal unit 7 is used for the management of motor vehicles 3 belonging to the delivery base. An operator of the delivery company can make a delivery plan and a charging plan for motor vehicles 3 by using operation management terminal unit 7. Operation management terminal unit 7 can access sign detection system 1 via network 2.

Network 2 is a general term for channels, such as the Internet, leased lines, and virtual private networks (VPN), and any communication medium and communication protocol can be used for network 2. Examples of the communication medium that can be used include cellular phone networks (cellular networks), wireless LAN, cable LAN, optical fiber networks, ADSL networks, and CATV networks. Examples of the communication protocol that can be used include transmission control protocols (TCP)/internet protocols (IP), user datagram protocols (UDP)/IP, and Ethernet (registered trademark).

Figure 2:
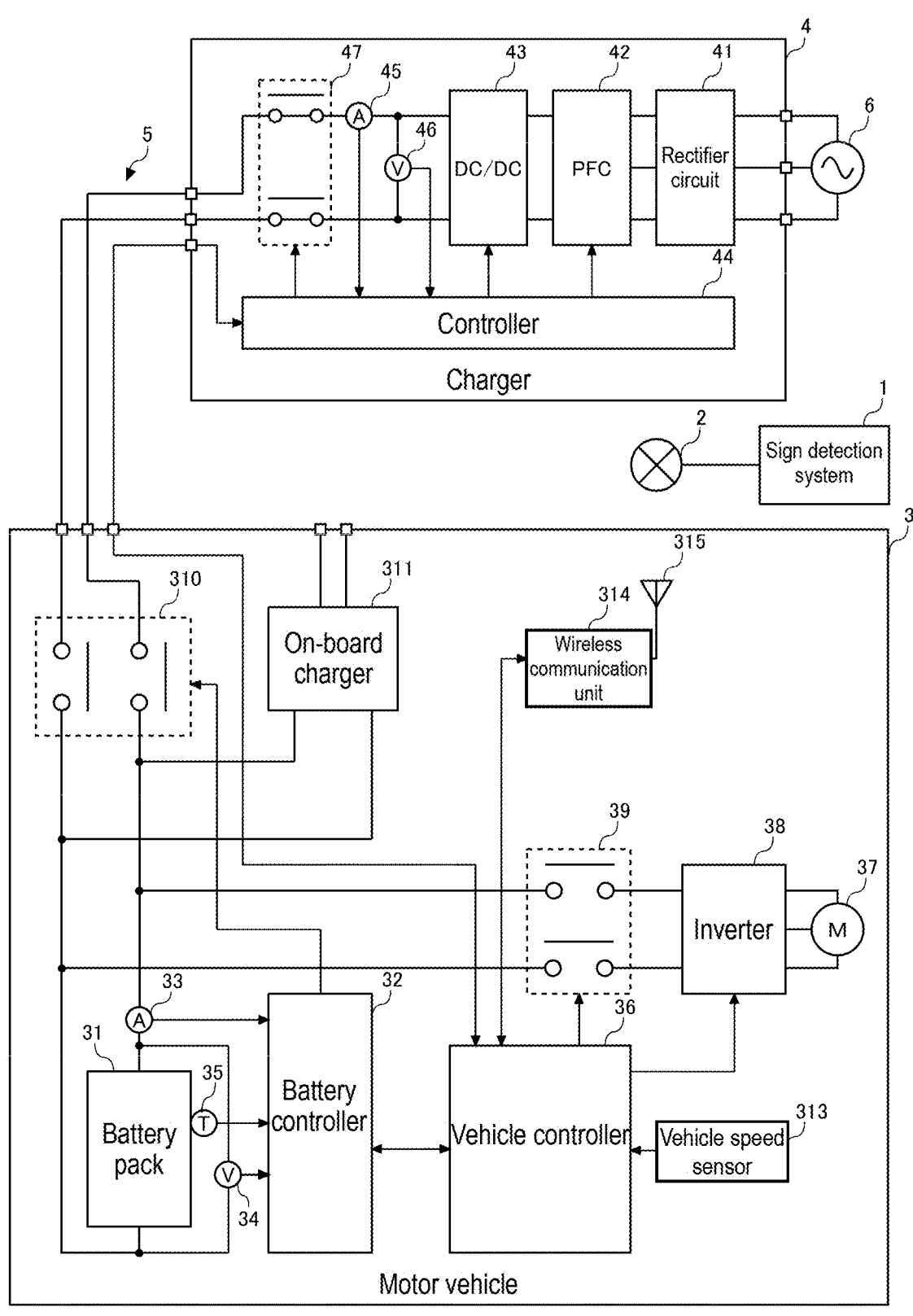
FIG. 2 is a diagram illustrating a configuration example of a charger and a motor vehicle.

FIG. 2 is a diagram illustrating a configuration example of charger 4 and motor vehicle 3. Charger 4 includes rectifier circuit 41, power factor correction (PFC) circuit 42, DC-DC converter 43, controller 44, current sensor 45, voltage sensor 46, and output relay 47. In the embodiment, a boosting charger in accordance with CHAdeMO (registered trademark) is assumed.

Rectifier circuit 41 performs the full-wave rectification of an alternating-current (AC) voltage (for example, three-phase AC 200 V) supplied from commercial power system 6. PFC circuit 42 improves the power-factor of full-wave rectified electric power. DC-DC converter 43 is an insulated DC-DC converter and controls a current or voltage of direct-current (DC) power supplied from PFC circuit 42. Current sensor 45 detects an output current of DC-DC converter 43 and outputs to controller 44. Voltage sensor 46 detects an output voltage of DC-DC converter 43 and outputs to controller 44.

Control unit 44 controls the output current and the output voltage of DC-DC converter 43, based on the output current detected by current sensor 45 and the output voltage detected by voltage sensor 46, respectively. Control unit 44 includes a microcontroller, a communication controller, and a nonvolatile memory (for example, an electrically erasable programmable read-only memory (EEPROM) or a flash memory).

In the CHAdeMO and ChaoJi standards, a controller area network (CAN) is used as a mode for communications between charger 4 and motor vehicle 3 via charging cable 5. In the Combo standard, power line communication (PLC) is used. Charging cable 5 conforming to the CHAdeMO standard includes a CAN communication line. Control unit 44 includes a CAN controller as a communication controller for controlling communication with vehicle controller 36 in motor vehicle 3.

Commonly, constant current (CC)-constant voltage (CV) charge is used for charging battery pack 31. A target current value during a constant-current charge period is sometimes fixed or sometimes gradually changed.

In the control of constant-current charge, controller 44 controls DC-DC converter 43 so as to keep the output current detected by current sensor 45 at the target current value. Specifically, when the output current detected is higher than the target current value, controller 44 generates a current command value for decreasing the output current of DC-DC converter 43, meanwhile when the output current detected is lower than the target current value, controller 44 generates a current command value for increasing the output current of DC-DC converter 43. DC-DC converter 43 operates switching in accordance with a driving signal based on the generated current command value.

In the control of constant-current charge, when the difference between the output current detected by current sensor 45 and the target current value is a predetermined value (for example, within a range of 5% to 20%) or larger, controller 44 determines that a current abnormality has been occurred, and accordingly executes a protection operation to stop charging. As the protection operation, controller 44 stops the operation of DC-DC converter 43 and controls output relay 47 to an OFF state (open state). After stopping the charging, controller 44 executes a reboot sequence to resume charging to battery pack 31. A restart sequence normally takes approximately several ten seconds for safety.

For example, when contact resistance increases due to the above-mentioned poor connection caused by corrosion and looseness of the fastening unit, the output current of charger 4 cannot be kept at the target current value and decreases. Furthermore, when the fastening unit comes off, the output current of charger 4 becomes 0.

When the output current detected by current sensor 45 exceeds an overcurrent threshold, controller 44 executes a protection operation to stop charging. Also in this case, after stopping the charging, controller 44 executes the reboot sequence to resume charging to battery pack 31. For example, when the above-mentioned instant short-circuit due to metal deposition occurs, a large current instantly flows through the short-circuit path, whereby the output current of charger 4 exceeds the overcurrent threshold.

Motor vehicle 3 includes battery pack 31, battery controller 32, current sensor 33, voltage sensor 34, temperature sensor 35, vehicle controller 36, motor 37, inverter 38, first relay 39, second relay 310, on-board charger 311, vehicle speed sensor 313, wireless communication unit 314, and antenna 315.

Battery pack 31 includes a plurality of cells connected in series or in series-parallel. Examples of the cells that can be used include lithium ion battery cells, nickel hydride battery cells, and lead battery cells. Hereinafter, in the present specification, an example of using lithium ion battery cells (nominal voltage: 3.6 to 3.7 V) is assumed.

Current sensor 33 detects a current flowing through battery pack 31 and outputs to battery controller 32. Voltage sensor 34 detects a voltage of battery pack 31 and outputs to battery controller 32. Although not illustrated, voltage sensor 34 can also detect a voltage of each of the serially-connected cells included in battery pack 31. Temperature sensor 35 detects a temperature of battery pack 31 and outputs to battery controller 32. Temperature sensor 35 may be provided in two or more portions of battery pack 31.

Battery controller 32 (also referred to as BMU or BMS) includes a microcontroller, a communication controller, and a nonvolatile memory. Battery controller 32 and vehicle controller 36 are connected to each other via an in-vehicle network (for example, CAN or local interconnect network (LIN)). The communication controller controls communication with vehicle controller 36.

Battery controller 32 estimates a state of charge (SOC), a full charge capacity (FCC), and a state of health (SOH) of each of the cells included in battery pack 31.

Battery controller 32 estimates an SOC by using a combination of an open circuit voltage (OCV) method and a current integration method. The OCV method is a method of estimating an SOC, based on an OCV of a cell and an SOC-OCV curve of cells. The SOC-OCV curve of the cells is beforehand created based on a characteristic test performed by a battery maker and registered in an internal memory of the microcontroller at the time of shipment.

The current integration method is a method of estimating an SOC, based on an OCV of a cell at the start of charge-and-discharge and an integrated value of currents flowing through the cell. In the current integration method, as a charge-and-discharge time is longer, the cumulative amount of current measurement errors is larger. Therefore, an SOC estimated using the current integration method is preferably corrected using an SOC estimated by the OCV method.

Battery controller 32 is capable of estimating an FCC by dividing an integrated value of current flowing during a period from the start of charge-and-discharge to the end thereof by a change in SOC in the period. An SOC at the start of charge-and-discharge and an SOC at the end of charge-and-discharge can be each determined from the measured OCV and SOC-OCV curve. The SOH is defined by a ratio of a present FCC to an initial FCC, and a smaller SOH value (closer to 0%) indicates the progress of deterioration.

Battery controller 32 transmits the voltages, currents, temperatures, SOCs, FCCs, and SOHs of the cells and battery pack 31 to vehicle controller 36 via the in-vehicle network.

Vehicle controller 36 is a vehicle electronic control unit (ECU) that controls the entirety of motor vehicle 3 and may be configured with an integrated vehicle control module (VCM), for example. Vehicle controller 36 includes: a communication controller for connecting to the in-vehicle network; and a communication controller (for example, a CAN controller) for communicating with controller 44 of charger 4 via charging cable 5.

Motor vehicle 3 includes a three-phase AC motor as motor 37 for driving. At the time of powering, inverter 38 converts DC power supplied from battery pack 31 into AC power and supplies the AC power to motor 37. At the time of regeneration, inverter 38 converts AC power supplied from motor 37 into DC power and supplies the DC power to battery pack 31. At the time of powering, motor 37 rotates in accordance with the AC power supplied from inverter 38. At the time of regeneration, motor 37 converts rotational energy caused by speed reduction into AC power and supplies the AC power to inverter 38.

First relay 39 is a contactor interposed in wiring connecting between battery pack 31 and inverter 38. During running, vehicle controller 36 controls first relay 39 to an ON state (a closed state) and thereby electrically connect battery pack 31 to inverter 38. During non-running, vehicle controller 36 basically controls first relay 39 to an OFF state (an open state) and thereby electrically interrupts the connection between battery pack 31 and inverter 38.

Second relay 310 is a relay interposed in direct-current wiring connecting between battery pack 31 and an inlet into which charging cable 5 is inserted. Battery controller 32 controls second relay 310 to the ON state during charging by charger 4 and controls second relay 310 to the OFF state after the end of charging.

On-board charger 311 is used when a cable equipped with an AC plug is inserted into a standard charger or a general-purpose AC outlet to perform a charge with AC power. On-board charger 311 performs the full-wave rectification of an AC voltage supplied via the cable equipped with the AC plug, improves the power-factor of the full-wave rectified power, controls a current or voltage of the DC power having the improved power-factor, and supplies the current or voltage to battery pack 31.

On-board charger 311 has basically the same function as that of charger 4. In the control of constant-current charge, when the difference between a detected charge current and a target current value is a predetermined value (for example, within a range of 5% to 20%) or larger, on-board charger 311 determines that a current abnormality has occurred, and accordingly executes a protection operation to stop charging. After stopping charging, on-board charger 311 executes a reboot sequence to resume charging battery pack 31. The same goes for overcurrent detection.

Vehicle speed sensor 313 generates a pulse signal proportional to the rotational speed of a vehicle shaft, and transmits the generated pulse signal to vehicle controller 36. Vehicle controller 36 detects the speed of motor vehicle 3, based on the pulse signal received from vehicle speed sensor 313.

Wireless communication unit 314 performs signal processing for establishing wireless connection with network 2 via antenna 315. Examples of a wireless communication network allowing motor vehicle 3 to establish wireless connection therewith include cellular-phone networks (cellular networks), wireless LAN, vehicle-to-infrastructures (V2I), vehicle-to-vehicle (V2V), electronic toll collection (ETC) systems, and dedicated short range communications (DSRC).

During the running of motor vehicle 3, vehicle controller 36 can transmit running data including battery data to sign detection system 1 on a real-time basis by using wireless communication unit 314. The running data include at least the speed of motor vehicle 3. The battery data include the voltages, currents, temperatures, SOCs, and SOHs of the cells and battery pack 31. Vehicle controller 36 samples these data periodically (for example, at intervals of 10 seconds) and transmits the data to sign detection system 1 every time the sampling is performed.

Vehicle controller 36 may store the running data of motor vehicle 3 in an internal memory and collectively transmit the running data stored in the memory at a predetermined timing. For example, vehicle controller 36 collectively transmits the running data stored in the memory to operation management terminal unit 7 after the completion of the day's work. Operation management terminal unit 7 transmits the running data of motor vehicles 3 to sign detection system 1 at a predetermined timing.

Alternatively, at the time of charging by charger 4 having a network communication function, vehicle controller 36 may collectively transmit the running data stored in the memory to charger 4 via charging cable 5. Charger 4 transmits the received running data to sign detection system 1. This example is effective in the case where charger 4 has the network communication function and motor vehicle 3 does not have a wireless communication function.

Also during the parking of motor vehicle 3, vehicle controller 36 samples the battery data periodically (for example, at intervals of 10 seconds) and stores the battery data in the internal memory. The battery data in the charging of battery pack 31 by charger 4 during the parking of motor vehicle 3 include a charging start time and a charging end time. The charging start time and the charging end time can be specified, for example, from a communication log between charger 4 and motor vehicle 3. Vehicle controller 36 transmits the battery data stored in the memory to sign detection system 1 at a predetermined timing (for example, at the time of start of running).

Figure 3:
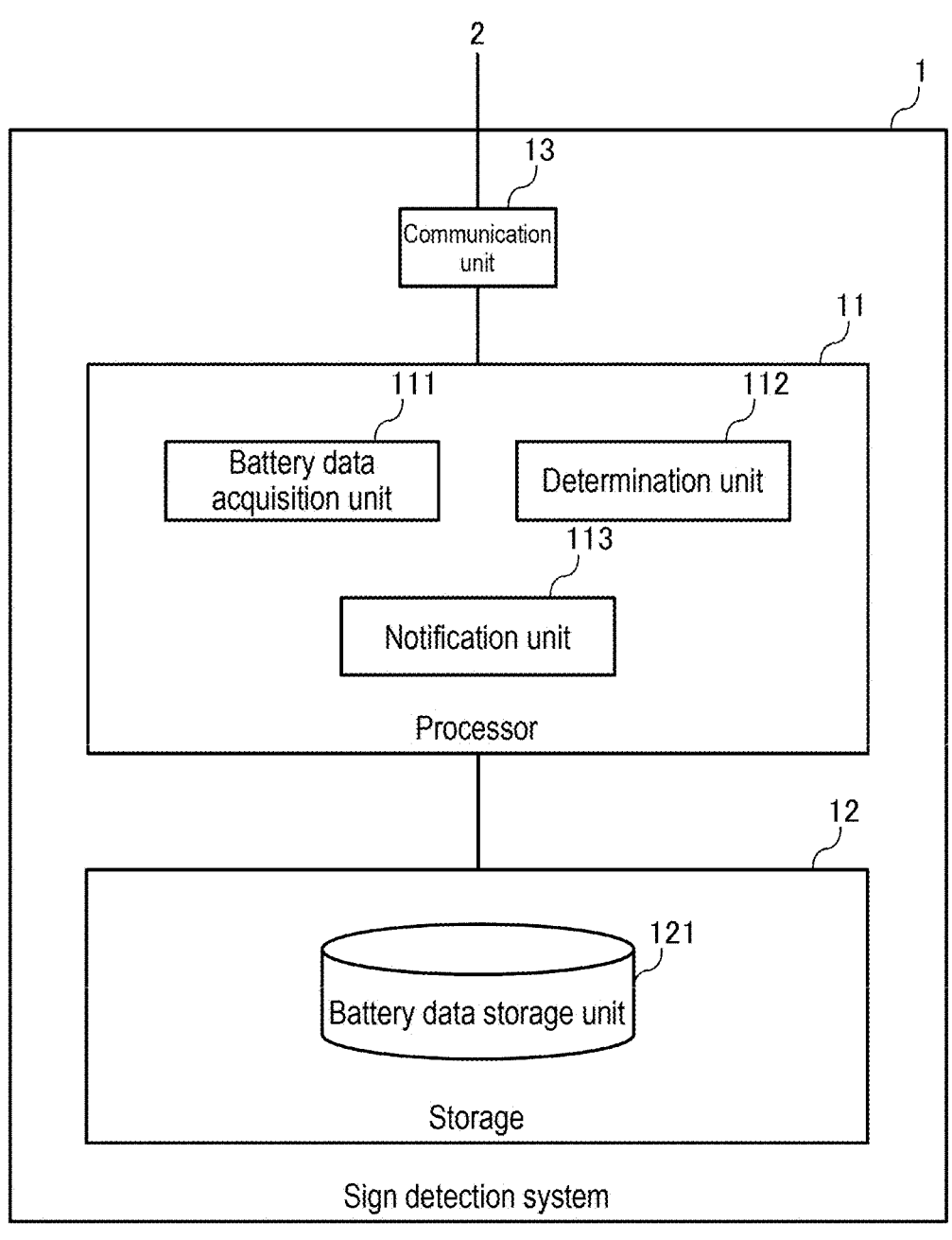
FIG. 3 is a diagram illustrating a configuration example of the sign detection system according to the embodiment.

FIG. 3 is a diagram illustrating a configuration example of sign detection system 1 according to the embodiment. Sign detection system 1 includes processor 11, storage 12, and communication unit 13. Communication unit 13 is a communication interface for wired- or wireless-connection to network 2.

Processor 11 includes battery data acquisition unit 111, determination unit 112, and notification unit 113. The function of processor 11 can be realized by a combination of a hardware resource and a software resource or only by a hardware resource. Examples of the hardware resource that can be used include CPU, ROM, RAM, graphics processing units (GPU), application specific integrated circuits (ASIC), field programmable gate arrays (FPGA), and other LSIs. Examples of the software resource that can be used include programs such as operating systems and applications.

Storage 12 includes battery data storage unit 121. Storage 12 includes a nonvolatile recording medium, such as a hard disk drive (HDD) or a solid state drive (SSD), and records various data.

Battery data acquisition unit 111 acquires running data during the running of motor vehicle 3 (including battery data) or battery data during the parking of motor vehicle 3, via network 2, and stores the acquired battery data in battery data storage unit 121. The running data other than the battery data may be stored in battery data storage unit 121 together with the battery data or may be stored separately in another running data storage unit (not-illustrated).

Determination unit 112 executes a periodical inspection (for example, once a month) to check whether or not a sign of unstable battery pack 31 installed in motor vehicle 3 has occurred. In the periodical inspection, determination unit 112 reads, from battery data storage unit 121, battery data on targeted battery pack 31 stored in battery data storage unit 121.

For the read battery data, determination unit 112 determines whether or not current data during the period of charging target battery pack 31 by charger 4 (hereinafter, referred to as the charge period) include a section temporarily having a current value of zero (hereinafter, referred to as the zero-current section). In the present specification, the period of charging battery pack 31 from commercial power system 6 by using charger 4 (hereinafter, considered to include on-board charger 311) is regarded as the charge period. The charge period shall not include the period of regenerative charging from motor 37.

When the current data in the charge period include the zero-current section, determination unit 112 determines that the occurrence of the zero-current section is a sign of unusable battery pack 31 or is possibly the sign.

The zero-current section in the charge period basically indicates a section in which charging has been stopped by a protection function of charger 4. A period of the zero-current section corresponds to a period between a charging stop caused by the protection function of charger 4 and a resumption of charging (in the above-mentioned example, approximately several ten seconds). For example, when the current data are sampled at intervals of 10 seconds, the zero-current section includes one to several sampling sections.

Actually, even when the current data in the charge period include the zero-current data section, there is a possibility that the zero-current section occurs due to a malfunction in a measurement system including current sensor 33, a data loss during transmission, data alteration, or the like. Therefore, there can be conceived an additional method of enhancing a probability that the zero-current section in the charge period serves as data generated by executing the protection function of charger 4.

First, a method of considering the frequency of occurrence of the zero-current section generates during the charge period is conceived. In a first method of considering the frequency of the occurrence, when the current data in the charge period include the zero-current section and an interval of occurrence of the zero-current section is shorter than a previous interval, determination unit 112 determines that the occurrence of the zero-current section is a sign of unusable battery pack 31. Note that the interval of occurrence of the zero-current section is detected based on the frequency of the occurrence in a period between a zero-current section and a subsequent zero-current section or a predetermined period in a charge period.

In a second method of considering the frequency of the occurrence, when the current data in the charge period include the zero-current section and the zero-current sections occurs two or more times during one charge period or a predetermined period in the charge period, determination unit 112 determines that the occurrence of the zero-current section is a sign of unusable battery pack 31. Note that one charge period means a period in which one charging continues, that is, a period from the start of charging to the end of charging, and also means a period from the start of charging until an SOC is set at the end of charge or until charge is terminated compulsorily. The predetermined period in the charge period means a fixed period set in advance or a predetermined period set based on current data items stored in a server, the current data items include the current data.

Usually, deposition of lithium metal grows in a tree form, and therefore instant short-circuits occur at a plurality of portions. As the deposition progresses, the interval of occurrence of the instant short-circuit becomes shorter. Furthermore, as the corrosion of the fastening unit progresses, a period in which resistance increases is longer, whereby the frequency with which charger 4 cannot keep the constant current control increases. Therefore, when an interval of occurrence of the zero-current data is shorter than a previous interval, it can be presumed that the deposition of lithium metal is in progress, or the corrosion of the fastening unit is in progress. When the zero-current section occurs two or more times during one charge, it can be presumed that deposition and corrosion are in progress, hence battery pack 31 is almost unusable.

Next, a method of taking an energy loss into consideration is conceived as the method of enhancing a probability that the zero-current section in the charge period serves as data generated by executing the protection function of charger 4. When current data in the charge period include the zero-current section and a current integrated value in the charge period including the zero-current section is (a) larger than a current integrated value in a discharge period immediately before the charge period. (b) larger than a current integrated value in a discharge period immediately after the charge period, or (c) larger than the current integrated values in both the discharge periods, determination unit 112 determines that the occurrence of the zero-current section is a sign of unusable battery pack 31. Any of the conditions (a) to (c) may be used.

In the case of battery pack 31 mounted on motor vehicle 3, usually, charging to the extent of SOC=100% is not performed and discharging to the extent of SOC=0% is not performed. Therefore, a starting point and an ending point of the charge period and a starting point and an ending point of the discharge period need to be determined based on various data.

Figure 4:
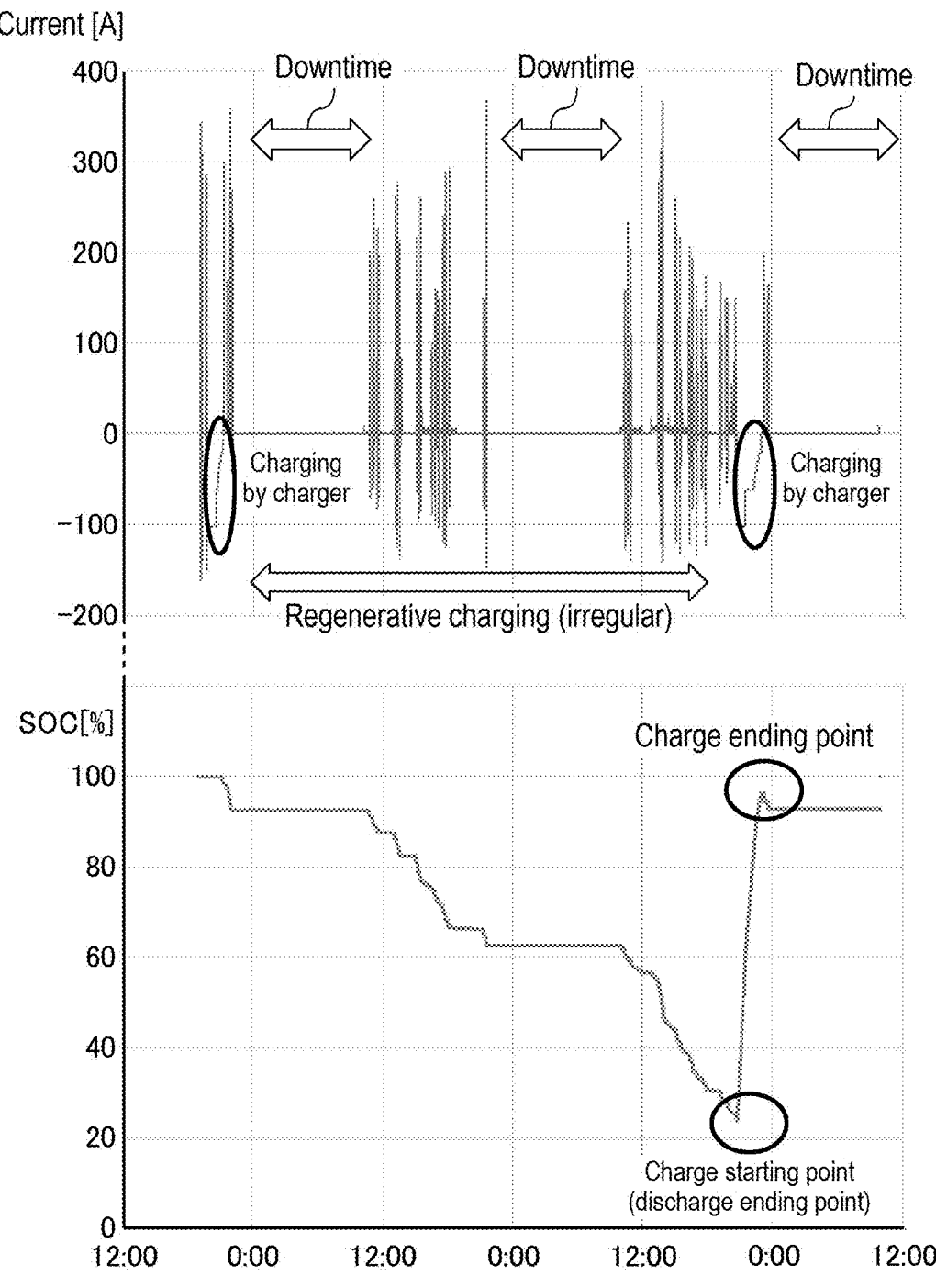
FIG. 4 is a diagram illustrating a specific example of three days' battery data for a motor vehicle.

FIG. 4 is a diagram illustrating a specific example of three days' battery data for motor vehicle 3. An upper part in the diagram is a plot of current data, and a lower part in the diagram is a plot of SOC data. In the current data in FIG. 4, a positive value represents a discharging current and a negative value represents a charging current. In an example in FIG. 4, based on constant-current/constant-voltage charging in which a charge current gradually decreases, battery pack 31 is charged by charger 4. An irregular charge current other than the above is a charge current based on regenerative charging. Furthermore, a downtime of approximately 12 hours has occurred in one day.

In the case where the battery data include a communication log between charger 4 and motor vehicle 3, determination unit 112 can specify the charging start time and the charging end time, based on the communication log. In the example in FIG. 4, an SOC at the charging start time is 24% and an SOC at the charging end time is 96%.

Determination unit 112 sets the ending time of the discharge period immediately before the charge period including the zero-current section (hereinafter, referred to as the pre-charge discharge period) to the charging start time in the charge period. Determination unit 112 sets the starting time of the pre-charge discharge period to the time of the next previous SOC corresponding to the SOC at the charging end time in the charge period.

Figure 5:
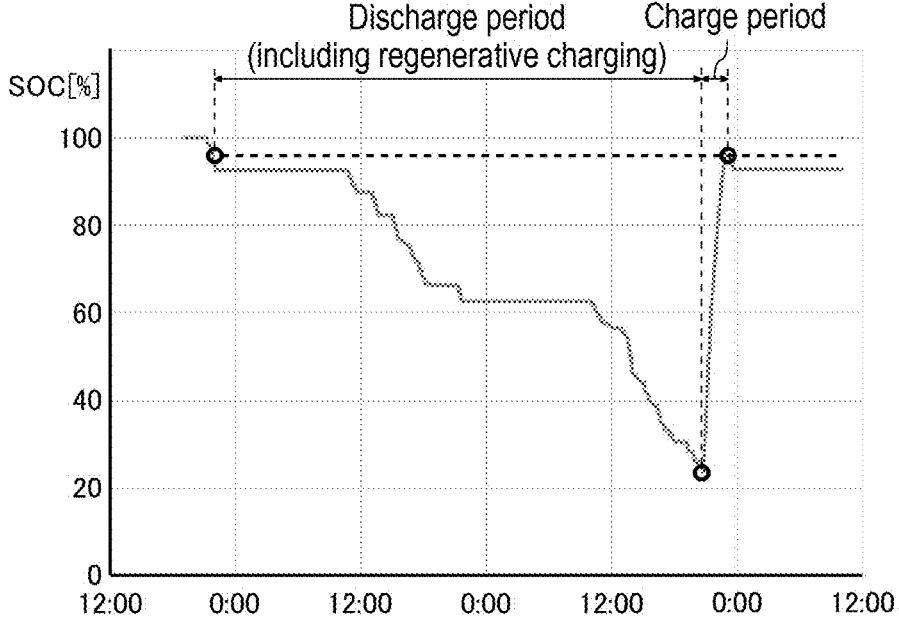
FIG. 5 is a diagram for explaining a method of setting a pre-charge discharge period.

FIG. 5 is a diagram for explaining a method of setting the pre-charge discharge period. In an example in FIG. 5, determination unit 112 sets the time of the latest SOC at which the SOC of battery pack 31 is equal to the SOC (=96%) of the ending time of the charge period including the zero-current section to the starting time of the pre-charge discharge period, and sets the starting time of the charge period to the ending time of the pre-charge discharge period.

Determination unit 112 calculates the total charge capacity [Ah] in the charge period by adding up current values in the charge period. Determination unit 112 calculates the total discharge capacity [Ah] in the pre-charge discharge period by adding up current values in the pre-charge discharge period.

The total discharge capacity in the pre-charge discharge period is obtained by subtracting an integrated value of regenerative charging current values from an integrated value of discharging current values in the pre-charge discharge period. The integrated value of the discharging current values in the pre-charge discharge period includes not only values of discharging current supplied to motor 37 but also values of discharging current supplied to an auxiliary device (not illustrated) in motor vehicle 3.

The total charge capacity in the charge period and the total discharge capacity in the pre-charge discharge period are basically in agreement with each other. That is, the charge-and-discharge efficiency (=the total charge capacity in the charge period/the total discharge capacity in the pre-charge discharge period)=1.

When an instant short-circuit occurs due to deposition of lithium metal during the charge period, a current flowing through a short-circuit path is not charged into battery pack 31, which results in an energy loss. Furthermore, also when contact resistance increases due to corrosion and looseness of the fastening unit, battery pack 31 is not charged and energy consumed by the contact resistance increases. Therefore, when the charge period includes the zero-current section, the total charge capacity is larger by an energy loss in the zero-current section than the total discharge capacity.

When the total charge capacity in the charge period including the zero-current section is larger than the total discharge capacity in the pre-charge discharge period, determination unit 112 can determine that the occurrence of the zero-current section is a sign of unusable battery pack 31.

Note that, when there is a standby current not measured by current sensor 33 (for example, power consumption of a sensor or a microcomputer, a self-discharge of a cell), determination unit 112 estimates an integrated value of standby current in the pre-charge discharge period, based on an estimated temperature-specific standby current for a running period, an estimated temperature-specific standby current for a parking period (downtime), a cumulative running time in the pre-charge discharge period, a cumulative parking time in the pre-charge discharge period, temperature data in each of the periods, and the like. The method of estimating an integrated value of standby current is just an example, and the integrated value of standby current can be estimated by various methods other than the above-mentioned method.

Determination unit 112 adds the estimated integrated value of standby current in the pre-charge discharge period to the total discharge capacity in the pre-charge discharge period, or subtracts the estimated integrated value of standby current in the pre-charge discharge period from the total charge capacity in the charge period. Alternatively, determination unit 112 may correct a determined value to a value less than 1, based on the estimated integrated value of standby current in the pre-charge discharge period.

Determination unit 112 sets the starting time of a discharge period immediately after the charge period including the zero-current section (hereinafter, referred to as the post-charge discharge period) to the charge ending time in the charge period. Determination unit 112 sets the ending time of the post-charge discharge period to the time of a subsequent SOC corresponding to the SOC at the charging start time in the charge period. When the total charge capacity in the charge period including the zero-current section is larger than the total discharge capacity in the post-charge discharge period, determination unit 112 can determine that the occurrence of the zero-current section is a sign of unusable battery pack 31.

Determination unit 112 calculates the total charge capacity [Ah] in the charge period by adding up current values in the charge period. Determination unit 112 calculates the total discharge capacity [Ah] in the post-charge discharge period by adding up current values in the post-charge discharge period. When the total charge capacity in the charge period including the zero-current section is larger than the total discharge capacity in the post-charge discharge period, determination unit 112 can determine that the occurrence of the zero-current section is a sign of unusable battery pack 31.

Determination unit 112 can set the ending time of the post-charge discharge period to the time of an SOC being higher than the SOC at the charging start time in the charge period. In this case, determination unit 112 sets the charging start time in the charge period to the time of an SOC corresponding to the SOC at the ending time of the post-charge discharge period. Note that the shortened charge period needs to include the zero-current section.

When the total charge capacity in the charge period including the zero-current section is larger than the total discharge capacity in the pre-charge discharge period and larger than the total discharge capacity in the post-charge discharge period, determination unit 112 may determine that the occurrence of the zero-current section is a sign of unusable battery pack 31.

Next, a method of taking a temperature rise into consideration is conceived as the method of enhancing a probability that the zero-current section in the charge period serves as data generated by executing the protection function of charger 4. Even in the case where current data in the charge period include the zero-current section, when temperature data in the zero-current section have not risen by a predetermined value or more from the temperature data in a period before the zero-current section, determination unit 112 determines that the occurrence of the zero-current section is not a sign of unusable battery pack 31. The predetermined value is determined based on data resulting from experiments and simulations, the findings of a designer, and the likes.

Usually, an overcurrent caused by an instant short-circuit and an increase in resistance due to poor connection are accompanied by an increase in Joule's heat. Therefore, there is a high possibility that the zero-current section without a temperature rise occurred due to another factor such as a malfunction in the measurement system.

In this case, determination unit 112 determines that the occurrence of the zero-current section is not a sign of unusable battery pack 31. The method of taking a temperature rise into consideration is more effective when used in combination with the method of taking the frequency of occurrence of the zero-current section into consideration or the method of taking an energy loss into consideration.

Notification unit 113 sends an alert to motor vehicle 3 including battery pack 31 in which a sign of unusable battery pack 31 has been detected or to operation management terminal unit 7 that manages motor vehicle 3, to notify that battery pack 31 becomes unusable in the future.

Figure 6:
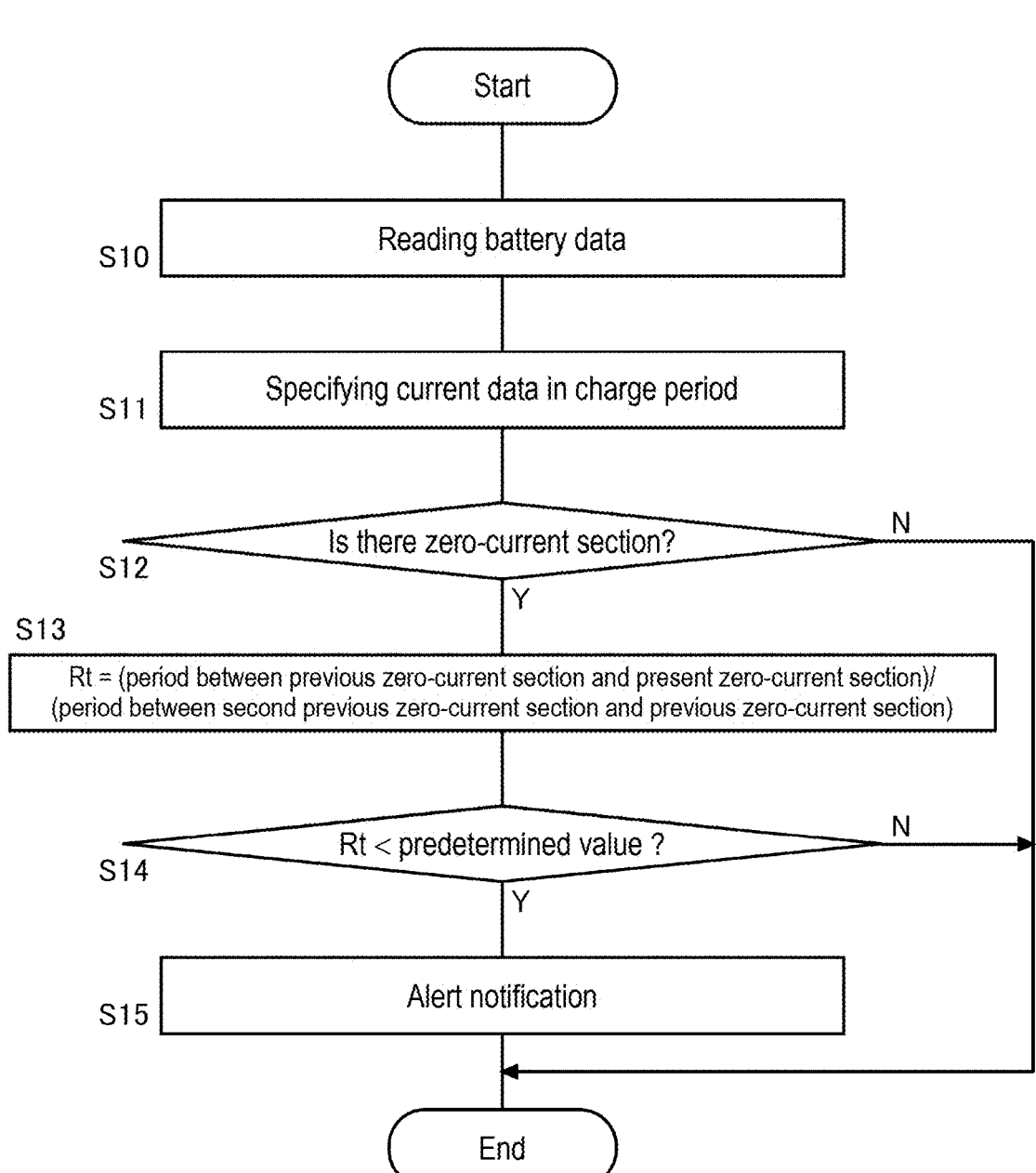
FIG. 6 is a flow chart illustrating the flow of a first processing example of detecting a sign of an unusable battery pack, by using the sign detection system according to the embodiment.

FIG. 6 is a flow chart illustrating the flow of a first processing example of detecting a sign of unusable battery pack 31, by using sign detection system 1 according to the embodiment. From battery data storage unit 121, determination unit 112 reads battery data on battery pack 31 as an inspection target, the battery data being stored in battery data storage unit 121 (S10). Determination unit 112 identifies current data in the charge period from the read battery data (S11).

Determination unit 112 determines whether or not the current data in the charge period include the zero-current section (S12). If the zero-current section is not included (No at S12), determination unit 112 ends the inspection of battery pack 31. If the zero-current section is included (Yes at S12), determination unit 112 performs a calculation using the following Formula 1 (S13).

$$Rt=\text{(period between the previous zero-current section and the present zero-current section)}/\text{(period between the second previous zero-current section and the previous zero-current section)} \quad \text{(Formula 1)}$$

Determination unit 112 compares the period ratio Rt with a predetermined value (a value less than 1) (S14). The predetermined value is determined based on data resulting from experiments and simulations, the findings of a designer, and the likes. For example, the predetermined value may be set to 0.5.

If the period ratio Rt is equal to or larger than the predetermined value (No at S14), determination unit 112 ends the inspection of battery pack 31. If the period ratio Rt is smaller than the predetermined value (Yes at S14), determination unit 112 determines that the occurrence of the zero-current section is a sign of unusable battery pack 31. To motor vehicle 3 including battery pack 31 or to operation management terminal unit 7 that manages motor vehicle 3, notification unit 113 sends an alert via network 2 to notify that battery pack 31 becomes unusable in the near future (S15).

FIG. 7 is a flow chart illustrating the flow of a second processing example of detecting a sign of unusable battery pack 31, by using sign detection system 1 according to the embodiment. The second processing example is an example in which processing at step S14*a* is added to the first processing example. If the period ratio Rt is smaller than the predetermined value (Yes at S14), determination unit 112 determines whether or not temperature data in the zero-current section have risen by a predetermined value or more from temperature data in a period before the zero-current section. If the temperature data in the zero-current section have not risen by the predetermined value (No at S14*a*), determination unit 112 ends the inspection of battery pack 31. If the temperature data in the zero-current section have risen by the predetermined value (Yes at S14*a*), determination unit 112 determines that the occurrence of the zero-current section is a sign of unusable battery pack 31. Notification unit 113 sends the above-described alert (S15).

Figure 8:
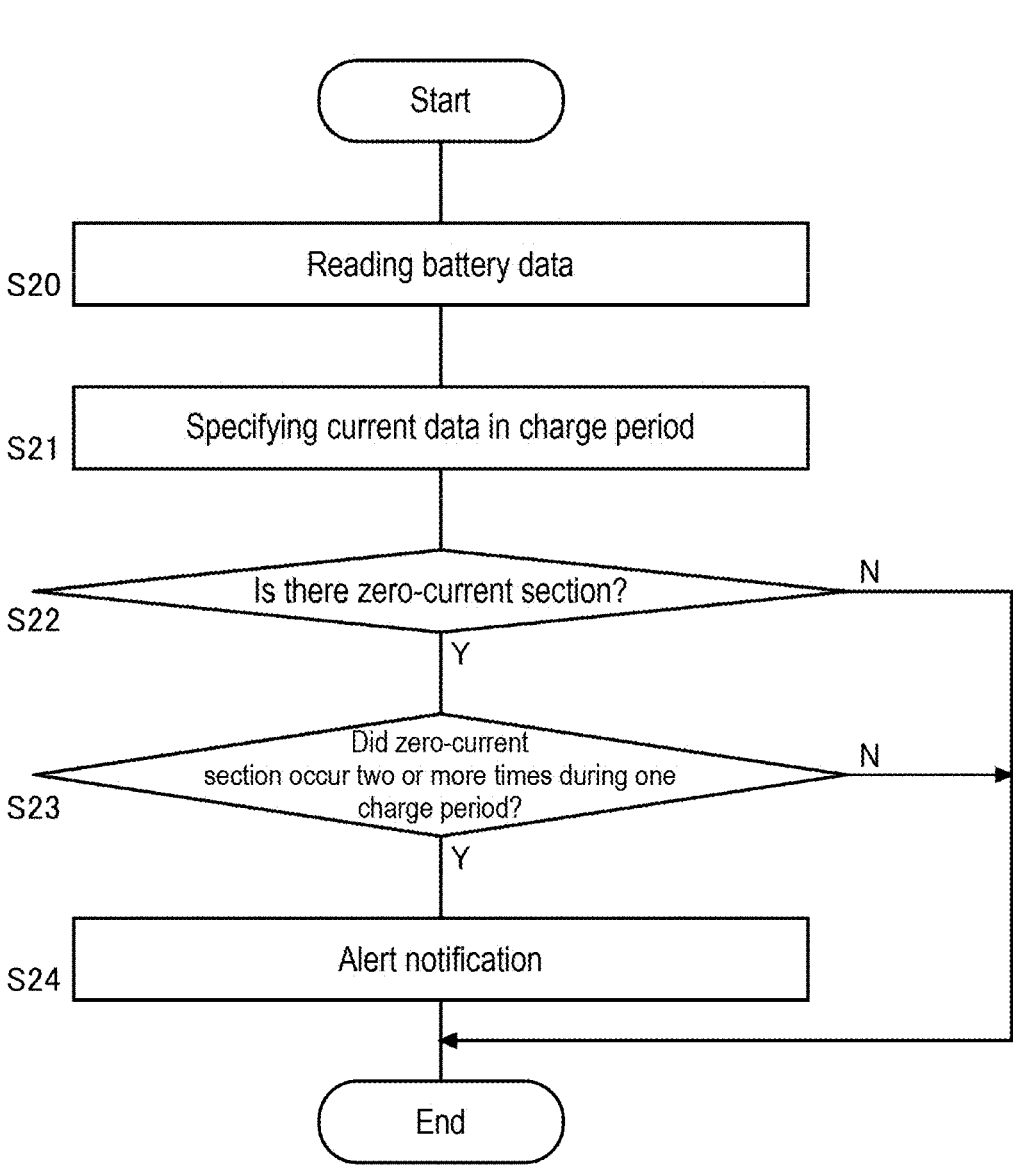
FIG. 8 is a flow chart illustrating the flow of a third processing example of detecting the sign of the unusable battery pack, by using the sign detection system according to the embodiment.

FIG. 8 is a flow chart illustrating the flow of a third processing example of detecting a sign of unusable battery pack 31, by using sign detection system 1 according to the embodiment. Processing at steps S20 to S22 in the third processing example is the same as the processing at steps S10 to S12 in the first processing example. If current data in the charge period include the zero-current section (Yes at S22), determination unit 112 determines whether or not the zero-current section has occurred two or more times in the charge period (in one charge period) (S23). If the zero-current section has not occurred two or more times (No at S23), determination unit 112 ends the inspection of battery pack 31. If the zero-current section has occurred two or more times (Yes at S23), determination unit 112 determines that the occurrence of the zero-current section is a sign of unusable battery pack 31. Notification unit 113 sends the above-described alert (S24). Note that, as in the case of the second processing example, whether or not the zero-current section is accompanied by a temperature rise may be added as a condition.

FIG. 9 is a flow chart illustrating the flow of a fourth processing example of detecting a sign of unusable battery pack 31, by using sign detection system 1 according to the embodiment. Processing at steps S30 to S32 in the fourth processing example is the same as the processing at steps S10 to S12 in the first processing example. If current data in the charge period include the zero-current section (Yes at S32), determination unit 112 calculates a total charge capacity B in the charge period, a total discharge capacity A in the pre-charge discharge period, and a total discharge capacity C in the post-charge discharge period (S33). Determination unit 112 determines whether or not both a condition, (total charge capacity B/total discharge capacity A)>1, and a condition, (total discharge capacity C/total charge capacity B)<1, are satisfied (S34). If the conditions are not satisfied (No at S34), determination unit 112 ends the inspection of battery pack 31. If the conditions are satisfied (Yes at S34), determination unit 112 determines that the occurrence of the zero-current section is a sign of unusable battery pack 31. Notification unit 113 sends the above-described alert (S35).

FIG. 10 is a flow chart illustrating the flow of a fifth processing example of detecting a sign of unusable battery pack 31, by using sign detection system 1 according to the embodiment. The fifth processing example is an example in which the processing at step S34*a* is added to the fourth processing example. If the conditions at step S34 are satisfied (Yes at S34), determination unit 112 determines whether or not temperature data in the zero-current section have risen by a predetermined value or more from temperature data in a period before the zero-current section (S34*a*). If the temperature data in the zero-current section have not risen by the predetermined value (No at S34*a*), determination unit 112 ends the inspection of battery pack 31. If the temperature data in the zero-current section have risen by the predetermined value (Yes at S34*a*), determination unit 112 determines that the occurrence of the zero-current section is a sign of unusable battery pack 31. Notification unit 113 sends the above-described alert (S35).

As described above, according to the present embodiment, a sign of unusable battery pack 31 can be detected with high accuracy at low cost. As described above, the zero-current section included in the current data in the charge period for battery pack 31 occurs based on the protection operation of charger 4 against detected overcurrent or a constant-current control error. For safety, charger 4 often sets a recharge sequence period between a charging stop due to detected overcurrent or a constant-current control error and a resumption of charging to several ten seconds to approximately one minute. During this reboot sequence, control for gradually increasing a current value is often performed.

It has been found that the zero-current section caused by the protection operation of charger 4 highly frequently occurs in the end of life of a cell. In the present embodiment, the occurrence of the zero—current section caused by the protection operation of charger 4 can be found, and a sign of a trouble such as heat generation or fire can be detected before the occurrence of the trouble.

Figure 11:
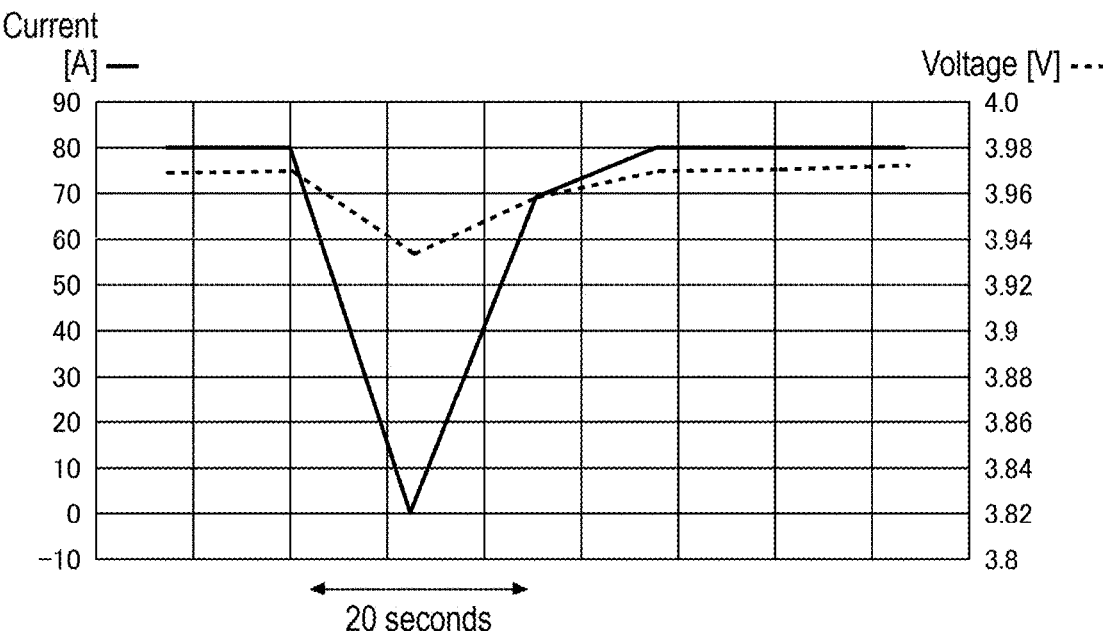
FIG. 11 is a diagram illustrating an example of changes in current data and voltage data in a period including a protection operation period of the charger.

FIG. 11 is a diagram illustrating an example of changes in current data and voltage data in a period including a protection operation period of charger 4. In an example in FIG. 11, current changes like 80 A→0 A→80 A and voltage changes like 3.97V→3.93V→3.97V in the period including the protection operation period of charger 4. In this period, current changes by 100%, meanwhile voltage changes only by approximately 1%. The degree of changes in pack voltage is still smaller than the degree of changes in cell voltage.

To detect a sign of unusable battery pack 31, based on changes in voltage, voltage needs to be monitored and recorded all the time with high-speed sampling in a range of microseconds to milliseconds. Therefore, an expensive bulk memory allowing rapid access is needed. Furthermore, the power consumption of the measurement system increases.

In contrast, in the case of detecting the sign based on changes in current, a 100% change in current is detected while utilizing the existing observation system as it is, whereby the sign can be detected with higher accuracy than in the case of detection based on a minute change in voltage. By utilizing the rapid-response protection operation of charger 4 and the recharge sequence taking several ten seconds to approximately one minute, a current can be sufficiently monitored with low-speed sampling and recorded. An expensive memory is unnecessary, and an additional sensor is also unnecessary, hence, additional hardware cost is basically zero. The detection can be performed using only the existing data stored in the cloud. Furthermore, the power consumption of the measurement system does not increase.

Furthermore, by taking the frequency of occurrence of the zero-current section, an energy loss, a temperature rise, and the like into consideration, whether the occurrence of the zero-current section is caused by deterioration of a cell or an abnormality in a current path or is caused by an accidental abnormality (noise factor) other than the above can be accurately distinguished. Thus, the sign of unusable battery pack 31 can be detected with higher accuracy.

According to the present embodiment, by notifying a user beforehand of the sign of unusable battery pack 31, the user can replace battery pack 31 at an optimal timing as predictive maintenance. Thus, the user can minimize downtime while pursuing economic rationality.

Hereinbefore, the present disclosure has been described, based on the embodiment. Those skilled in the art will understand that the embodiment is merely an example and various modifications can be made to a combination of the constituents and a combination of the processing processes and such modifications are also included within the scope of the present disclosure.

The sign detection system described above may be mounted on battery controller 32 in motor vehicle 3. In particular, the processing of detecting a sign of unusable battery pack 31, based on whether or not the zero-current section has occurred two or more times during one charge period is suitable for mounting onto battery controller 32. From an event in which the zero-current section occurs two or more times during one charge period, it is presumed that deposition and corrosion are in progress and thereby battery pack 31 are almost unusable. At the time when the zero-current section occurs two or more times during one charge period, battery controller 32 may determine that battery pack 31 is unusable.

In the above-described embodiment, a four-wheeled electric vehicle is assumed as motor vehicle 3. However, motor vehicle 3 may be an electric motorcycle (an electric scooter), an electric assisted bicycle, or an electric kick scooter. Furthermore, examples of the electric vehicle include not only full-standard electric vehicles but also slow-moving electric vehicles such as golf carts and land-cars to be used in shopping malls, amusement parks, and the like. An object including battery pack 31 is not limited to motor vehicle 3. Examples of the object include electric motor ships, railway vehicles, and mobile units such as multicopters (drones).

Note that the embodiment may be specified by the following items.

[Item 1] A sign detection system (1), including:

an acquisition unit (111) configured to acquire battery data including current data, the current data being obtained by periodically measuring a current flowing through a battery pack (31); and a determination unit (112) configured to, when the current data in a period of charging the battery pack (31) by a charger (4) include a section temporarily having a current value of zero, determine that occurrence of the section having the current value of zero is a sign of the battery pack (31) becoming unusable.

Thus, by using the current data, the sign of the battery pack (31) becoming unusable can be detected with high accuracy at low cost.

[Item 2] The sign detection system (1) according to Item 1, wherein running data of a plurality of electric mobile objects (3) each including the battery pack (31) are stored in a server (12), and, by using the current data included in the running data, the determination unit (112) determines the section having the current value of zero and serving as a criterion of the sign of the battery pack (31) becoming unusable.

Thus, there can be realized a cloud service that detects and provides the sign indicating that the battery pack (31) installed in each of the electric mobile objects (3) becomes unusable, based on the running data stored in the server (12).

[Item 3] The sign detection system (1) according to Item 1, wherein a period of the section temporarily having the current value of zero corresponds to a period between a charging stop caused by a protection function of the charger (4) and a resumption of charging.

Thus, by utilizing the protection function of the charger (4), a change of an observation system of the battery pack (31) can be made unnecessary.

[Item 4] The sign detection system (1) according to Item 1 or 3, wherein, when the current data in the period of charging the battery pack (31) by the charger (4) include the section temporarily having the current value of zero and an interval of occurrence of the section temporarily having the current value of zero is shorter than a previous interval, the determination unit (112) determines that the occurrence of the section having the current value of zero is the sign of the battery pack (31) becoming unusable.

Thus, by taking the frequency of the occurrence into consideration, the sign of the battery pack (31) becoming unusable can be detected with higher accuracy.

[Item 5] The sign detection system (1) according to Item 4, wherein a running data item of each of a plurality of electric mobile objects (3) each including the battery pack (31) is stored in a server (12), and, when the running data item includes current data items, the current data items including the current data, based on the current data items included in each of the running data item stored in the server (12), the determination unit (112) sets the interval of occurrence of the section temporarily having the current value of zero and serving as a criterion of the sign of the battery pack (31) becoming unusable.

Thus, there can be realized a cloud service that detects and provides a sign indicating that the battery pack (31) installed in each of the electric mobile objects (3) becomes unusable, based on the running data stored in the server (12).

[Item 6] The sign detection system (1) according to Item 1 or 3, wherein, when the current data in the period of charging the battery pack (31) by the charger (4) include the section temporarily having the current value of zero and the section temporarily having the current value of zero occurs two or more times during one charge, the determination unit (112) determines that the occurrence of the section having the current value of zero is the sign of the battery pack (31) becoming unusable.

Thus, by taking the frequency of the occurrence into consideration, the sign of the battery pack (31) becoming unusable can be detected with higher accuracy.

[Item 7] The sign detection system (1) according to Item 6, wherein a running data item of each of a plurality of electric mobile objects (3) each including the battery pack (31) is stored in a server (12), and, when the running data item includes current data items, the current data items including the current data, based on the current data items included in each of the running data item stored in the server (12), the determination unit (112) sets the frequency of occurrence of the section during one charge, the section temporarily having the current value of zero and serving as a criterion of the sign of the battery pack (31) becoming unusable.

Thus, there can be realized a cloud service that detects and provides a sign indicating that the battery pack (31) installed in each of the electric mobile objects (3) becomes unusable, based on the running data stored in the server (12).

[Item 8] The sign detection system (1) according to any of Items 1 to 7, wherein the battery data further include temperature data obtained by periodically measuring a temperature of the battery pack (31), and, even in the case where the current data in the period of charging the battery pack (31) by the charger (4) include the section temporarily having the current value of zero, when the temperature data in the period of the section temporarily having the current value of zero have not risen by a predetermined value or more from temperature data in a previous period, the determination unit (112) determines that the occurrence of the section having the current value of zero is not the sign of the battery pack (31) becoming unusable.

Thus, by taking a temperature rise into consideration, the sign of the battery pack (31) becoming unusable can be detected with higher accuracy.

[Item 9] A sign detection method, comprising the steps of:

acquiring battery data including current data, the current data being obtained by periodically measuring a current flowing through a battery pack (31); and, determining that, when the current data in a period of charging the battery pack (31) by a charger (4) include a section temporarily having a current value of zero, the occurrence of the section having the current value of zero is a sign of the battery pack (31) becoming unusable.

Thus, by using the current data, the sign of the battery pack (31) becoming unusable can be detected with high accuracy at low cost.

[Item 10] A sign detection program configured to cause a computer to execute:

processing of acquiring battery data including current data, the current data being obtained by periodically measuring a current flowing through a battery pack (31); and

processing of determining that, when the current data in a period of charging the battery pack (31) by a charger (4) include a section temporarily having a current value of zero, the occurrence of the section having the current value of zero is a sign of the battery pack (31) becoming unusable.

Thus, by using the current data, the sign of the battery pack (31) becoming unusable can be detected with high accuracy at low cost.

REFERENCE MARKS IN THE DRAWINGS

1 . . . sign detection system
2 . . . network
3 . . . motor vehicle
4 . . . charger
5 . . . charging cable
6 . . . commercial power system
7 . . . operation management terminal unit
11 . . . processor
111 . . . battery data acquisition unit
112 . . . determination unit
113 . . . notification unit
12 . . . storage
121 . . . battery data storage unit
31 . . . battery pack
32 . . . battery controller
33 . . . current sensor
34 . . . voltage sensor
35 . . . temperature sensor
36 . . . vehicle controller
37 . . . motor
38 . . . inverter
39 . . . first relay
310 . . . second relay
311 . . . on-board charger
313 . . . vehicle speed sensor
314 . . . wireless communication unit
315 . . . antenna
41 . . . rectifier circuit
42 . . . PFC circuit
43 . . . DC-DC converter
44 . . . control unit
45 . . . current sensor
46 . . . voltage sensor
47 . . . .

What is claimed is:

1. A sign detection system, comprising:
an acquisition unit configured to acquire battery data including current data, the current data being obtained by periodically measuring a current flowing through a battery pack; and
a determination unit configured to, when the current data in a period of constant current charging or constant voltage charging the battery pack by a charger include a section temporarily including a current value of zero, determine that occurrence of the section including the current value of zero is a sign of the battery pack to be unusable.

2. The sign detection system according to claim 1, wherein
running data items of a plurality of electric mobile objects each including the battery pack are stored in a server, and,
by using the current data included in each of the running data items, the determination unit determines the section including the current value of zero and serving as a criterion of the sign of the battery pack to be unusable.

3. The sign detection system according to claim 1, wherein
a period of the section temporarily including the current value of zero corresponds to a period between a charging stop caused by a protection function of the charger and a resumption of charging.

4. The sign detection system according to claim 1, wherein,
when the current data in the period of constant current charging or constant voltage charging the battery pack by the charger include the section temporarily including the current value of zero and an interval of occurrence of the section temporarily including the current value of zero is shorter than a previous interval, the determination unit determines that the occurrence of the section including the current value of zero is the sign of the battery pack to be unusable.

5. The sign detection system according to claim 4, wherein
a running data item of each of a plurality of electric mobile objects each including the battery pack is stored in a server, and,
when the running data item includes current data items, the current data items including the current data, based on the current data items included in each of the running data item stored in the server, the determination unit sets an interval of occurrence of the section temporarily including the current value of zero and serving as a criterion of the sign of the battery pack to be unusable.

6. The sign detection system according to claim 1, wherein,
when the current data in the period of constant current charging or constant voltage charging the battery pack by the charger include the section temporarily including the current value of zero and the section temporarily including the current value of zero occurs two or more times during one charge, the determination unit determines that the occurrence of the section including the current value of zero is the sign of the battery pack to be unusable.

7. The sign detection system according to claim 6, wherein
running data items of a plurality of electric mobile objects each including the battery pack are stored in a server, and,
based on the current data items included in the running data items stored in the server, the determination unit sets a frequency of occurrence of the section during one charge, the section temporarily including the current value of zero and serving as a criterion of the sign of the battery pack to be unusable.

8. The sign detection system according to claim 1, wherein
the battery data further include temperature data obtained by periodically measuring a temperature of the battery pack, and,
even in a case where the current data in the period of constant current charging or constant voltage charging the battery pack by the charger include the section temporarily including the current value of zero, when the temperature data in the period of the section temporarily including the current value of zero do not rise by a predetermined value or more from temperature data in a previous period, the determination unit determines that the occurrence of the section including the current value of zero is not the sign of the battery pack to be unusable.

9. A sign detection method, comprising:

acquiring battery data including current data, the current data being obtained by periodically measuring a current flowing through a battery pack; and, determining that, when the current data in a period of constant current charging or constant voltage charging the battery pack by a charger include a section temporarily including a current value of zero, occurrence of the section including the current value of zero is a sign of the battery pack to be unusable.

10. A non-transitory machine-readable recording medium that stores a sign detection program configured to cause a computer to execute:

processing of acquiring battery data including current data, the current data being obtained by periodically measuring a current flowing through a battery pack; and processing of determining that, when the current data in a period of constant current charging or constant voltage charging the battery pack by a charger include a section temporarily including a current value of zero, occurrence of the section including the current value of zero is a sign of the battery pack to be unusable.

\* \* \* \* \*